(12) United States Patent
Matsuzaki et al.

(10) Patent No.: US 6,421,285 B2
(45) Date of Patent: Jul. 16, 2002

(54) SEMICONDUCTOR STORAGE DEVICE USING REDUNDANCY METHOD

(75) Inventors: Yasurou Matsuzaki; Tsuneo Funatsu, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/855,662

(22) Filed: May 16, 2001

(30) Foreign Application Priority Data

Jul. 19, 2000 (JP) .................................... 2000-219756

(51) Int. Cl.[7] ................................................ G11C 7/00
(52) U.S. Cl. ..................................................... 365/200
(58) Field of Search ................................. 365/200, 222, 365/185.09; 714/6

(56) References Cited

U.S. PATENT DOCUMENTS

| | | | |
|---|---|---|---|
| 5,303,199 A | | 4/1994 | Ishihara et al. ............ 365/225.7 |
| 5,307,316 A | * | 4/1994 | Takemae ...................... 365/200 |
| 5,485,425 A | * | 1/1996 | Iwai et al. ..................... 365/200 |
| 6,181,614 B1 | * | 1/2001 | Aipperspach et al. ........ 365/200 |
| 6,337,817 B1 | * | 1/2002 | Horiguchi et al. ........... 365/200 |

FOREIGN PATENT DOCUMENTS

| | | |
|---|---|---|
| JP | 08083497 A | 3/1996 |
| JP | 2000123592 A | 4/2000 |
| JP | 2000215687 A | 8/2000 |

* cited by examiner

Primary Examiner—Tan T. Nguyen
(74) Attorney, Agent, or Firm—Arent Fox Kintner Plotkin & Kahn, PLLC

(57) ABSTRACT

A semiconductor storage device includes a redundancy circuit, which replaces a defective memory cell with a redundancy memory cell. The semiconductor storage device further includes a charge pump used for programming redundancy information by performing dielectric breakdown selectively to a capacity. In addition, a redundancy control circuit included in the semiconductor storage device supplies a fixed charge to the capacity, and refreshes the capacity, thereby reproducing the redundancy information programmed by use of the charge pump. Additionally, the redundancy control unit supplies the redundancy information to a redundancy circuit.

13 Claims, 12 Drawing Sheets

SEMICONDUCTOR STORAGE DEVICE USING REDUNDANCY METHOD

BACKGROUND OF THE INVENTION

1. Field of the Invention

The present invention generally relates to a semiconductor storage device. More particularly, the present invention relates to a semiconductor device that has a redundancy circuit relieving a defective memory cell.

2. Description of the Related Art

Generally, a DRAM (Dynamic Random Access Memory) is a volatile memory, and is refreshed periodically in order to hold data stored therein.

If a memory cell in the DRAM has a small defect, data stored in the memory cell vanishes at a faster speed than other normal memory cells. In order to prevent the data from vanishing, the DRAM must shorten an interval (a refresh time) to refresh its memory cells.

However, a certain amount of electricity is consumed for refreshing the memory cells. Consequently, a semiconductor storage device whose refresh time is short has a problem consuming a large amount of electricity.

Several related-art technologies are available that replace a defective memory cell with a redundancy memory cell. A more effective replacing method is always being researched to lengthen the refresh time of the DRAM.

SUMMARY OF THE INVENTION

Accordingly, it is a general object of the present invention to provide a semiconductor storage device. A more particular object of the present invention is to provide a semiconductor storage device having a redundancy function, which can reduce consumed electricity and can be easily manufactured.

The above-described object of the present invention is achieved by a semiconductor storage device, including a redundancy unit that replaces a memory cell with a redundancy memory cell according to redundancy information, if the memory cell has a defect; a plurality of charge storage devices that are programmed to have the redundancy information, each charge storage device having a fixed capacity; a redundancy-information recording unit programming the plurality of charge storage devices to set the redundancy information in the plurality of charge storage devices, by performing dielectric breakdown to the plurality of charge storage devices selectively; a charge supplying unit supplying a fixed charge to the plurality of charge storage devices; and a redundancy control unit that maintains the redundancy information in the plurality of charge storage devices supplied with the fixed charge by refreshing the plurality of charge storage devices, and supplies the redundancy information from the plurality of charge storage devices to the redundancy unit.

The semiconductor storage device according to the present invention reproduces programmed redundancy information just by refreshing the plurality of charge storage devices, thereby achieving a redundancy function with a simple structure. Additionally, the semiconductor storage device can set a refresh time for refreshing the plurality of charge storage devices to a comparatively long period, thereby reducing the consumed electricity.

Other objects, features and advantages of the present invention will become more apparent from the following detailed description when read in conjunction with the accompanying drawings.

DESCRIPTION OF THE PREFERRED EMBODIMENTS

Figure 1:
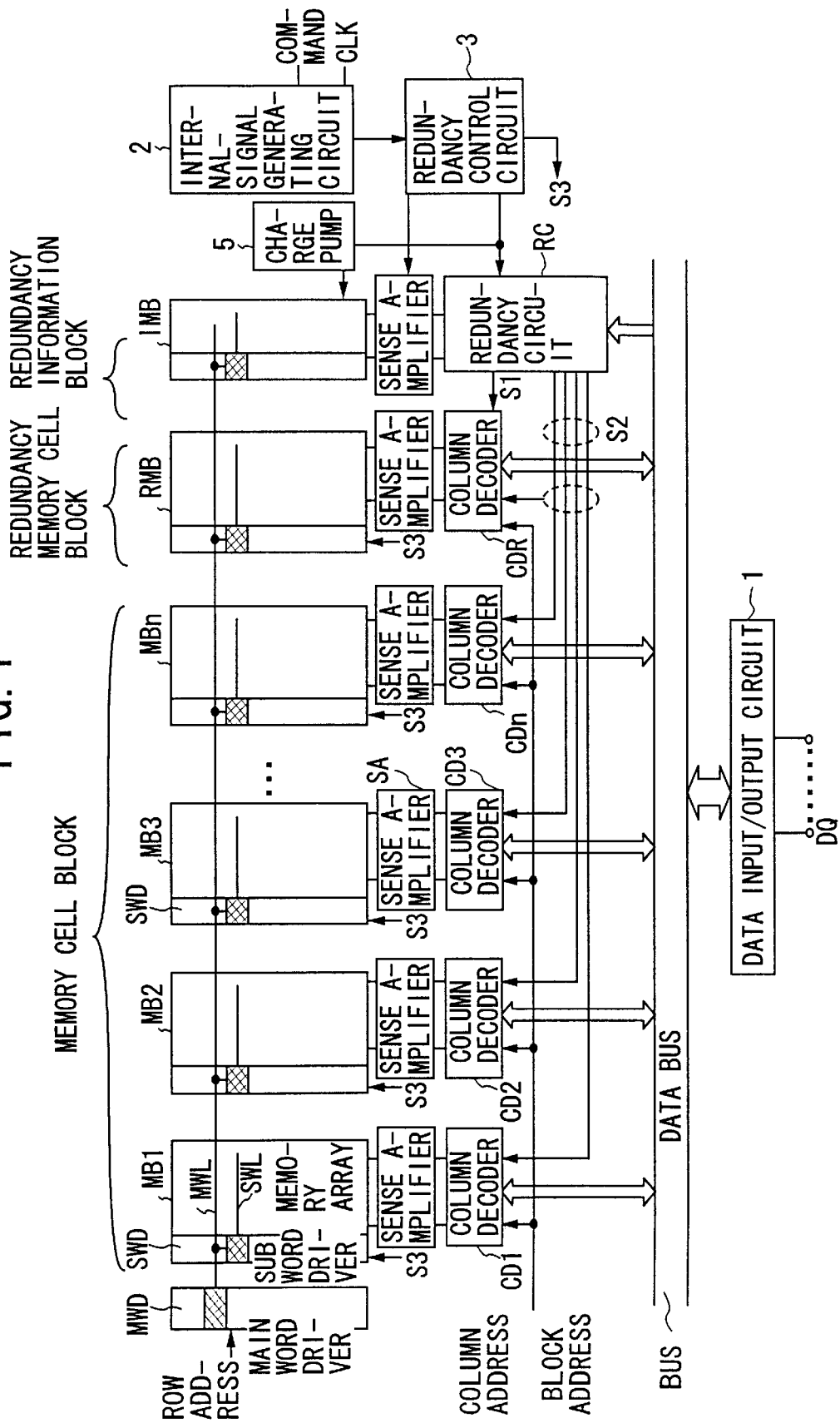
FIG. 1 is a block diagram showing a structure of a semiconductor storage device according to a first embodiment of the present invention.

A description will now be given of preferred embodiments of the present invention, with reference to the accompanying drawings. In the drawings, the same unit number used for a plurality of units indicates that the plurality of units are the same units or corresponding units.

FIG. 1 is a block diagram showing a structure of a semiconductor storage device according to a first embodiment of the present invention. The semiconductor storage device shown in FIG. 1 includes memory-cell blocks MB1 through MBn, each memory-cell block comprising a plurality of memory arrays. Each memory array including DRAM cells. The semiconductor storage device further includes a redundancy memory-cell block RMB, a redundancy information block IMB, a main word driver MWD, a sub word driver SWD, a sense amplifier SA, column decoders CD1 through CDn and CDR, a data input/output circuit 1, a data bus "BUS", a redundancy circuit RC, an internal-signal generating circuit 2, a redundancy control circuit 3, a charge pump 5, a main word line MWL, and a sub word line SWL.

The main word line MWL is shared among the memory-cell blocks MB1 through MBn, the redundancy memory-cell block RMB, and the redundancy information block IMB. The main word line MWL is operated by the main word driver MWD supplied with a row address. Additionally, each of the memory-cell blocks MB1 through MBn is provided with the sub word driver SWD and the sub word line SWL. The main word driver MWD selects the main word line MWL, and operates the main word line MWL. Subsequently, the sub word driver SWD, which is activated according to the main word line MWL operated by the main word driver MWD, operates the sub word line SWL.

Additionally, the sense amplifier SA is connected to each of the memory-cell blocks MB1 through MBn, the redundancy memory-cell block RMB, and the redundancy information block IMB. Each sense amplifier SA connected to the memory-cell blocks MB1 through MBn is connected with each of the column decoders CD1 through CDn. The sense amplifier SA connected to the redundancy memory-cell block RMB is connected with the column decoder CDR.

Each of the column decoders CD1 through CDn and CDR is supplied with a column address and a block address, and is connected to the data bus (BUS). Additionally, data DQ is inputted to each of the column decoders CD1 through CDn and CDR from the data input/output circuit 1 connected to the data bus, or is outputted from each of the column decoders CD1 through CDn and CDR to the data input/output circuit 1.

Additionally, the sense amplifier SA connected to the redundancy information block IMB is connected with the redundancy circuit RC. The redundancy circuit RC is connected to the data bus. The redundancy circuit RC supplies a later-described block unselecting signal S2 to the column decoders CD1 through CDn, and a later-described redundancy-block selecting signal S1 to the column decoder CDR.

The internal-signal generating circuit 2 generates internal signals such as a signal PROG and a signal SETUP, and supplies the internal signals to the redundancy control circuit 3, in accordance with a command and an external clock signal CLK supplied to the internal-signal generating circuit 2.

Additionally, the redundancy control circuit 3 is connected to the sense amplifier that is connected to the redundancy information block IMB, and the redundancy circuit RC. The redundancy control circuit 3 supplies a later-described sub-word-driver deactivating signal S3 to each sub word driver SWD included in the memory-cell blocks MB1 through MBn and the redundancy memory-cell block RMB.

The charge pump 5 is connected to the redundancy control circuit 3, and supplies a negative voltage to a plurality of memory cells included in the redundancy information block IMB. A detailed description about the charge pump 5 will be given later.

The redundancy information block IMB storing redundancy information comprises a plurality of DRAM cells, in the semiconductor storage device having the above-described structure, according to the first embodiment. The redundancy circuit RC controlled by the redundancy control circuit 3 programs redundancy information by breaking down a dielectric of a cell volume included in each DRAM cell electrically. Consequently, the cell volume whose dielectric is broken down has a high resistance and is short-circuited, and, thus, the redundancy information is maintained even when the semiconductor storage device is powered off.

When the semiconductor storage device is powered on for a regular usage, all the memory cells in the redundancy information block IMB are electrically charged. A memory cell whose dielectric is broken down has a pass for an electric charge to leak therefrom, and, thus, the electric charge stored in the memory cell escapes quickly from the memory cell.

Additionally, each memory cell included in the redundancy information block IMB is refreshed periodically. Thus, a memory cell whose dielectric is not broken down is kept electrically charged. A programmed memory cell whose dielectric is broken down is kept electrically uncharged.

Accordingly, programmed redundancy information is reproduced in a plurality of memory cells included in the redundancy information block IMB, and is supplied from the redundancy information block IMB to the redundancy circuit RC. The redundancy circuit RC, then, replaces a defective memory cell with a redundancy memory cell included in the redundancy memory-cell block RMB, according the redundancy information. The redundancy information includes, for instance, information about whether the redundancy memory-cell block RMB is to be used or not, and information about which memory-cell block MB1 through MBn is to be redundant.

A summary of the semiconductor storage device according to the first embodiment has been given above. Now, a detailed description of the semiconductor storage device according to the first embodiment will be given below.

Figure 2:
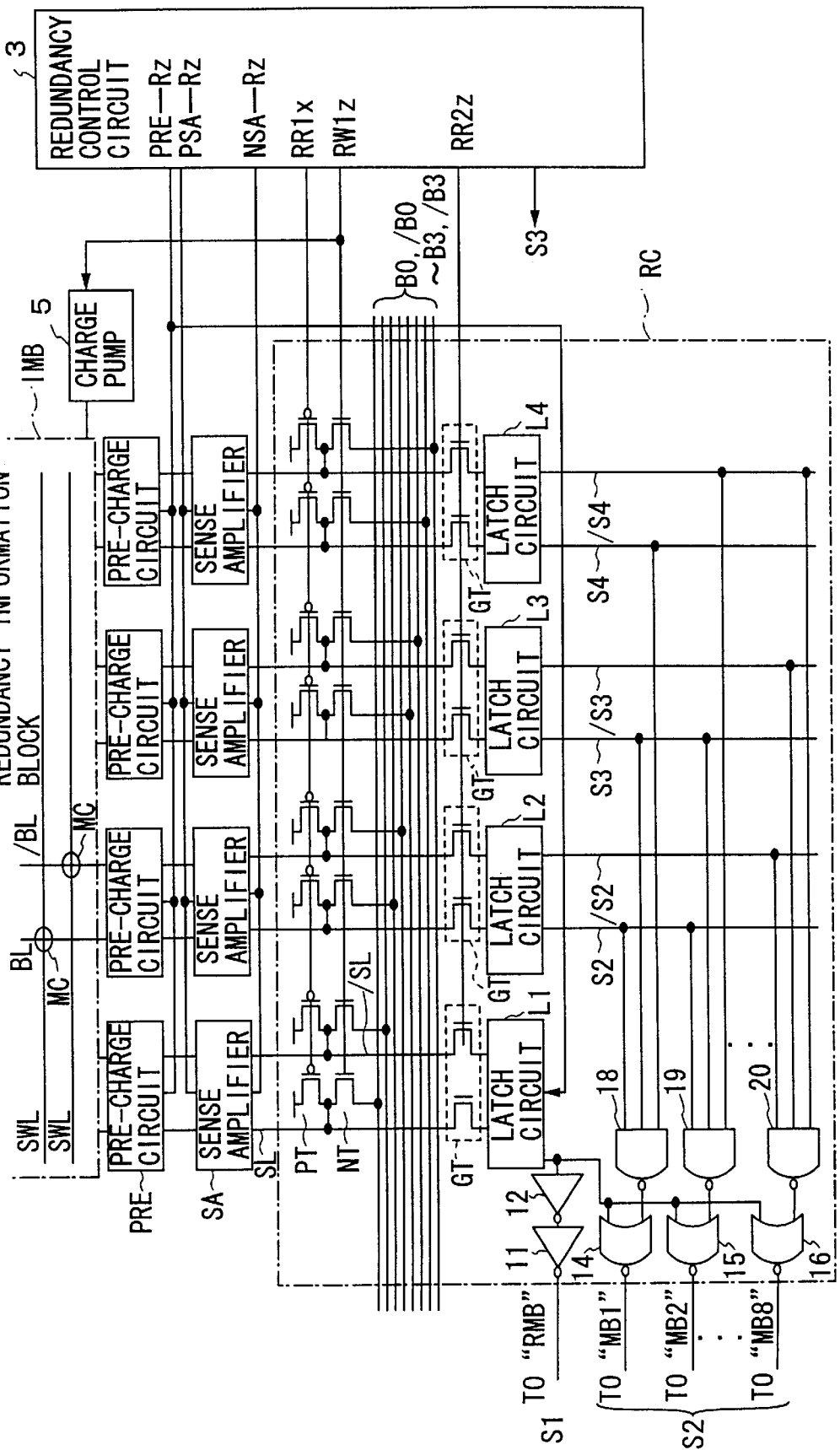
FIG. 2 is a circuit diagram showing a structure of a redundancy circuit included in the semiconductor storage device shown in FIG. 1.
Figure 3:
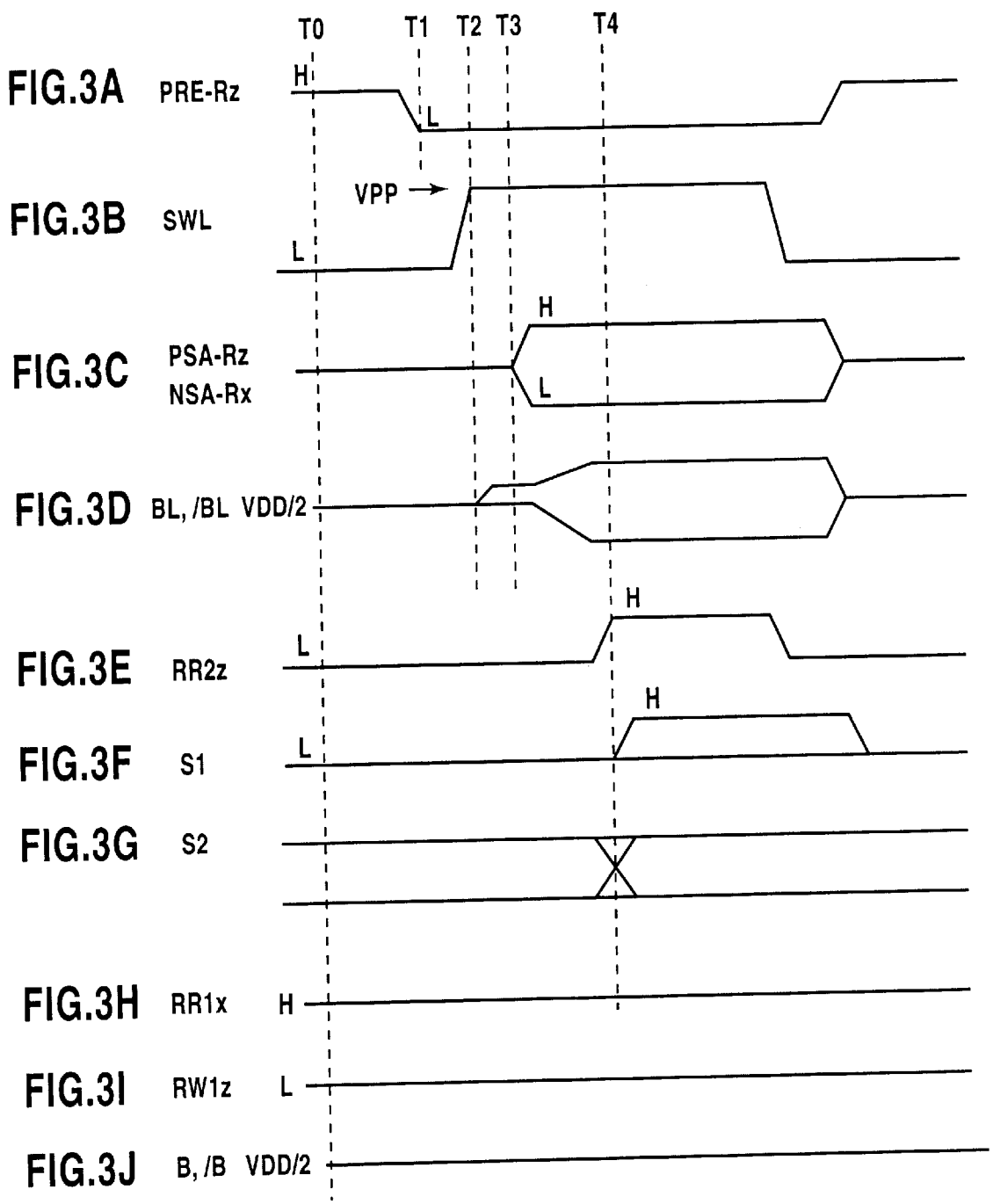
FIGS. 3A through 3J are timing diagrams showing an operation performed by the semiconductor storage device shown in FIG. 1 to read redundancy information.

FIG. 2 is a circuit diagram showing a structure of the redundancy circuit RC shown in FIG. 1. In FIG. 2, a single redundancy memory-cell block RMB is provided for eight memory-cell blocks MB1 through MB8, for example. If it is assumed that each of the memory-cell blocks MB1 through MB8 includes "n" sub word lines SWL and "m" pairs of bit lines BL and /BL, the redundancy memory-cell block also has the same structure as the memory-cell blocks MB1 through MB8. In such a case, the redundancy information block IMB includes "n" sub word lines SWL and four pairs of the bit lines.

Additionally, a pre-charge circuit PRE is provided between the sense amplifier SA and the redundancy information block IMB, as shown in FIG. 2, whereas FIG. 1 does not show the pre-charge circuit PRE. The data bus (BUS) shown in FIG. 1 is indicated as eight data buses B0, /B0, . . . , B3 and /B3, in FIG. 2.

The redundancy circuit RC includes eight p-channel MOS transistors PT, eight n-channel MOS transistors NT, the data buses B0, /B0, . . . , B3 and /B3, eight gate circuits GT, latch circuits L1 through L4, inverting circuits 11 and 12, NOR circuits 14 through 16, and NAND circuits 18 through 20.

The numbers of the p-channel MOS transistors PT and the numbers of the n-channel MOS transistors NT are equal to the number of the data buses B0, /B0, . . . , B3 and /B3, in which a p-channel MOS transistor PT and an n-channel MOS transistor NT are connected serially in each pair. The redundancy control circuit 3 supplies a signal RR1x to a gate of each p-channel MOS transistor PT, and a signal RW1z to a gate of each n-channel MOS transistor NT. The signal RR1x is also supplied to the charge pump 5. Additionally, drains of the p-channel MOS transistor PT and the n-channel MOS transistor NT are connected to a signal line SL or /SL that connects the sense amplifier SA and the gate circuit GT.

A gate of an n-channel MOS transistor composing each gate circuit GT is supplied with a signal RR2z from the redundancy control circuit 3, each gate circuit GT being connected to a corresponding latch circuit L1 through L4. The latch circuit L1 is supplied with a signal PRE-Rz from the redundancy control circuit 3 for resetting. The latch circuits L2, L3 and L4 are respectively connected with the signal lines S2 and /S2, S3 and /S3, and S4 and /S4, as shown in FIG. 2.

Additionally, an input node of the inverting circuit 12 is connected to the latch circuit L1. The inverting circuit 11 is connected to the inverting circuit 12, and outputs the signal S1 from its output node to the column decoder CDR corresponding to the redundancy memory-cell block RMB. On the other hand, input nodes of the NAND circuit 18 are connected to the signal lines S2, S3 and S4. Input nodes of the NAND circuit 19 are connected to the signal lines S2, S3 and /S4. In addition, input nodes of the NAND circuit 20 are connected to the signal lines /S2, /S3 and /S4.

The NOR circuit 14 has its input nodes connected to the latch circuit L1 and an output node of the NAND circuit 18, and its output node connected to the column decoder CD1 corresponding to the memory-cell block MB1. Similarly, the NOR circuit 15 has its input nodes connected to the latch circuit L1 and an output node of the NAND circuit 19, and its output node connected to the column decoder CD2 corresponding to the memory-cell block MB2. Further, the NOR circuit 16 has its input node connected to the latch circuit L1 and an output node of the NAND circuit 20, and its output node connected to the column decoder CD8 corresponding to the memory-cell block MB8.

Signals PSA-Rz and NSA-Rx are supplied from the redundancy control circuit 3 to each sense amplifier SA. The signal PRE-Rz is supplied from the redundancy control circuit 3 to each pre-charge circuit PRE.

The bit line BL and the complementary bit line /BL are included in the redundancy information block IMB, as shown in FIG. 2, and are provided with memory cells MC at intersections with the sub word lines SWL. The structure of the redundancy information block will be described later in detail.

In the redundancy circuit RC having the above-described structure, the latch circuit L1 outputs the signal L1 indicating whether to perform replacement by use of a redundancy information memory cell included in the redundancy memory-cell block RMB. Additionally, each of the latch circuits L2 through L4 outputs the signal S2 specifying a memory block to be unselected.

A description will be given below of an operation performed by the redundancy circuit RC shown in FIG. 2, with reference to timing charts shown in FIGS. 3A through 3J. It should be noted that a character "H" and a character "L" shown in FIG. 3 respectively indicate a power-source voltage VDD and a ground voltage VSS.

As shown in FIG. 3A, at a time T0, the high signal PRE-Rz (H) is initially supplied from the redundancy control circuit 3 to each pre-charge circuit PRE and the latch circuit L1. As a result, the bit line BL and the complementary bit line /BL are equalized and pre-charged to a half level of the VDD (VDD2), as well as the latch circuit L1 is reset.

At a time T1, the signal PRE-Rz is set low (L), as shown in FIG. 3A. After the signal PRE-Rz is set low, sub word lines SWL included in a selected memory-cell block (MB1 through MBn) are activated. Subsequently, sub word lines SWL that are included in the redundancy memory-cell block RMB and the redundancy information block IMB, and are connected to the same main word line MWL, are supplied with a boosting voltage VPP simultaneously at a time T2, as shown in FIG. 3B. The boosting voltage VPP is generated by an internal boosting circuit not shown in the figures, pumping an external power-source voltage supplied from outside the semiconductor storage device.

As shown in FIG. 3D, redundancy information programmed in the redundancy information block IMB is read out to pairs of the bit lines BL and /BL having the voltage VDD/2, by taking the above-described steps. Subsequently, as shown in FIG. 3C, signals of the redundancy information read out to the bit lines BL and /BL at the time T2 are amplified by the sense amplifiers SA that are activated by the high signal PSA-Rz and the low signal NSA-Rx supplied thereto, at a time T3.

At a time T4, the signal RR2z is shifted to a high level, as shown in FIG. 3E. Consequently, the gate circuits GT are activated, and the redundancy information is latched to the latch circuits L1 through L4. At the time T4, the signal S1 corresponding to the redundancy information is supplied from the redundancy circuit RC to the column decoder CDR, as shown in FIG. 3F. Additionally, the signal S2 corresponding to the redundancy information is supplied from the redundancy circuit RC to the column decoders CD1 through CD8, as shown in FIG. 3G.

If the signal S1 is low, memory cells included in the memory-cell blocks MB1 through MB8 become objects of reading data therefrom or writing data thereto. On the other hand, if the signal S1 is high, defective memory cells included in the memory-cell blocks MB1 through MB8 are replaced with redundancy memory cells included in the redundancy memory-cell block RMB.

In the case in which replacement of a memory cell is performed, the column decoder CDR is activated according to the signal S1. In addition, a column decoder corresponding to a memory-cell block that is an object of the replacement is deactivated according to the signal S2 specifying the memory-cell block to be replaced. Subsequently, the column decoder CDR sets a redundancy memory cell included in the redundancy memory-cell block RMB as an object of data reading or data writing, if a block address supplied thereto indicates the memory-cell block specified by the signal S2.

According to the above-described redundancy method, the semiconductor storage device can improve flexibility of a redundancy method relieving a defective memory cell, since the semiconductor storage device can replace memory cells connected to the sub word line SWL with redundancy memory cells all together.

As shown in FIGS. 3H and 3I, the signal RR1x and the signal RW1z outputted from the redundancy control circuit 3 are respectively set high and low, and, thus, the p-channel MOS transistors PT and the n-channel MOS transistors NT are turned off. In addition, voltages of the data buses B0 through /B3 are set to the voltage VDD/2, as shown in FIG. 3J.

The redundancy information programmed in the redundancy information block IMB is read out therefrom by a destructive read-out method similarly to information stored in a normal DRAM cell. However, the redundancy information read out from the redundancy information block IMB is amplified by the sense amplifiers SA, and is written back to original memory cells in the redundancy information block IMB. In addition, memory cells included in the redundancy information block IMB are periodically refreshed similarly to the memory cells included in the memory-cell blocks MB1 through MB8, and the redundancy memory-cell block RMB, thereby storing the redundancy information. This refreshing method applied to the redundancy information block IMB will be described later.

As described above, in the semiconductor storage device according to the first embodiment, redundancy information obtained by testing memory cells is programmed in the redundancy information block IMB comprising DRAM cells, and is stored therein until the redundancy information is used. A description will now be given of a method of programming redundancy information to memory cells included in the redundancy information block IMB, with reference to FIGS. 4 and 6A through 6J.

Figure 4:
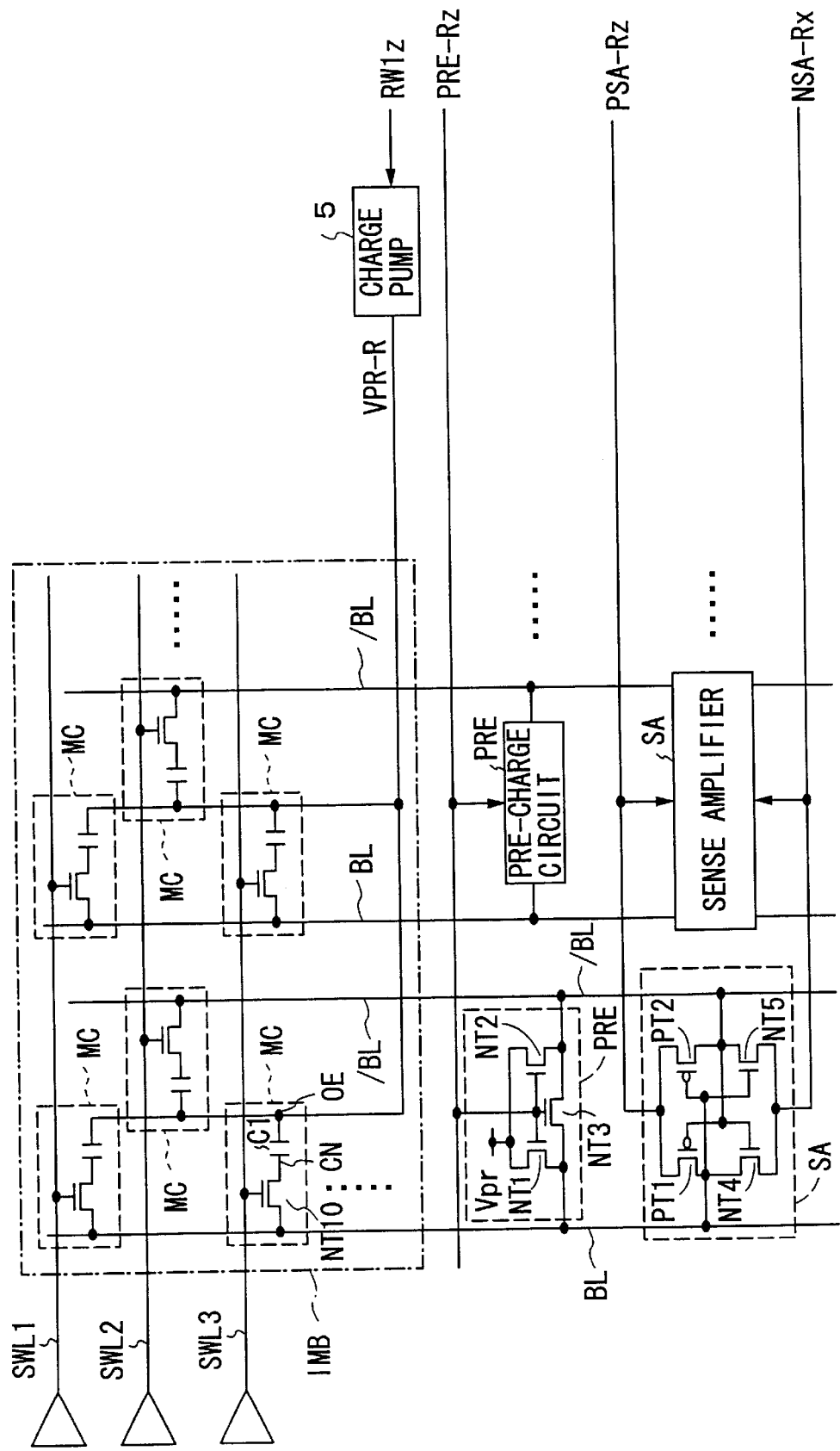
FIG. 4 is a circuit diagram showing a structure of a redundancy information block included in the semiconductor storage device shown in FIG. 1.

FIG. 4 is a circuit diagram showing a structure of the redundancy information block IMB shown in FIG. 1. FIG. 4 also shows structures of the pre-charge circuit PRE and the sense amplifier SA. The pre-charge circuit PRE includes n-channel MOS transistors NT1 through NT3, and supplies an equal voltage Vpr to a pair of the bit lines BL and /BL. The sense amplifier SA includes p-channel MOS transistors PT1 and PT2, and n-channel MOS transistors NT4 and NT5. The sense amplifier SA amplifies data read out to the pair of the bit lines BL and /BL.

As shown in FIG. 4, each memory cell MC included in the redundancy information block IMB is a normal DRAM cell, and includes a capacitor C1 and an n-channel MOS transistor NT10. The n-channel MOS transistor NT10 is connected to the capacitor C1 and one of the bit line BL and the complementary bit line /BL. A gate of the n-channel MOS transistor NT 10 is connected to one of sub word lines SWL1, SWL2 and SWL3. The capacitor C1 and the n-channel MOS transistor NT10 are connected at a cell node CN, and an opposing electrode OE is connected to the charge pump 5 generating a negative voltage. The charge pump 5 is not connected to memory cells included in the memory-cell blocks MB1 through MB8 and the redundancy memory-cell block RMB.

Figure 6:
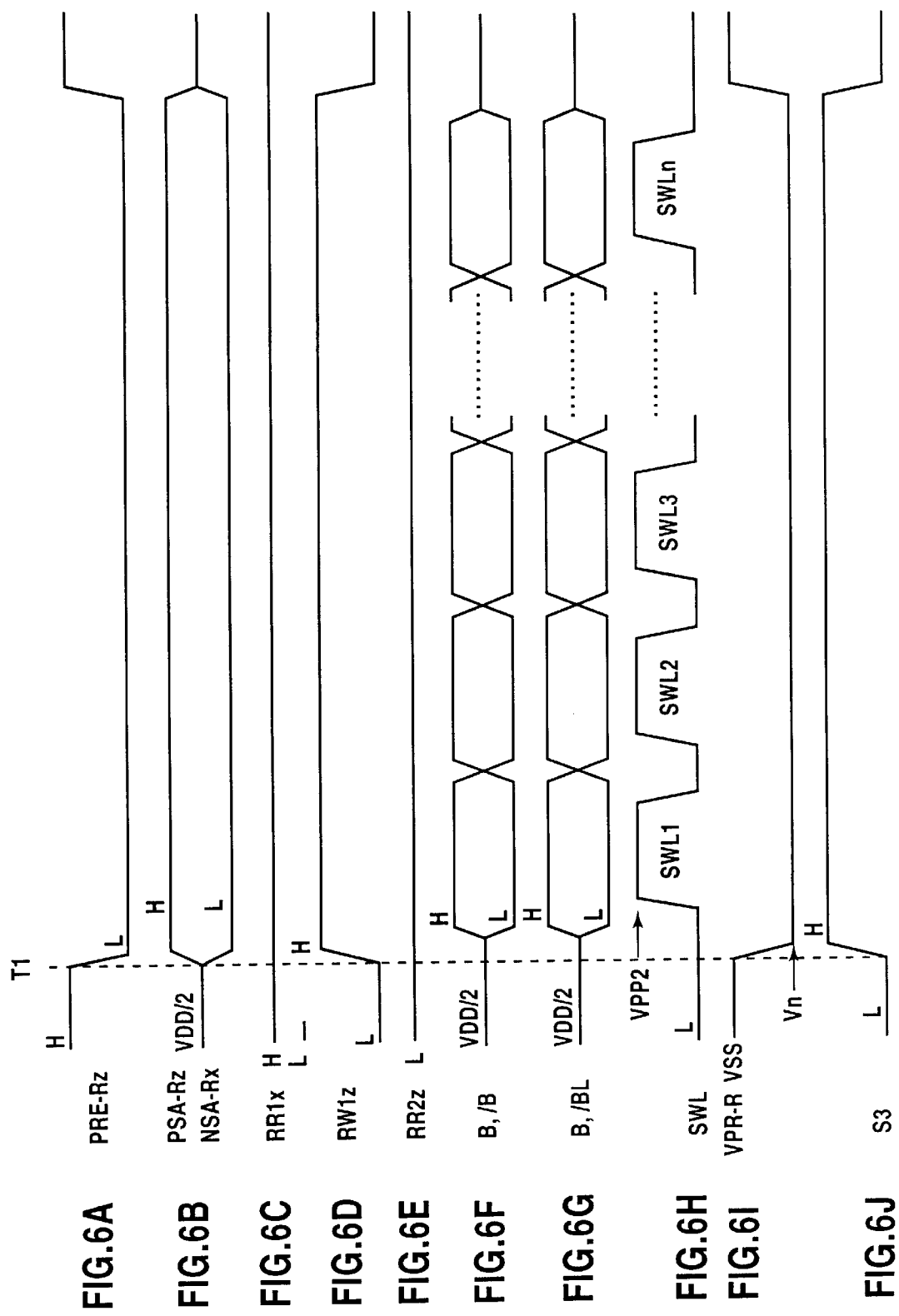
FIGS. 6A through 6J are timing diagrams showing an operation performed by the semiconductor storage device shown in FIG. 1 to program the redundancy information.

In the case in which redundancy information is programmed in the redundancy information block IMB having the above-described structure, the high signal RW1z is supplied from the redundancy control circuit 3 to the charge pump 5 at a time T1, as shown in FIG. 6D. As a result, the charge pump 5 is activated, and a voltage VPR-R outputted from the charge pump 5 is reduced from the ground voltage VSS to a voltage Vn, as shown in FIG. 6I. Alternatively, an exclusive pad or terminal may be provided in the semiconductor storage device, through which the negative voltage is supplied.

On the other hand, in a case of writing redundancy information to the redundancy information block IMB, a voltage higher than the internal power-source voltage VDD is supplied to the internal boosting circuit not shown in the figures, through an external power-source terminal that is included in the semiconductor storage device, but is not shown in the figures. The internal boosting circuit, then, generates a voltage VPP2 higher than the boosting voltage VPP, in accordance with the voltage supplied through the external power-source terminal. Subsequently, the voltage VPP2 generated by the internal boosting circuit is supplied to a selected sub word line SWL.

Additionally, at a time T1, the signal RW1z outputted from the redundancy control circuit 3 is set high, as shown in FIG. 6D. Thus, the n-channel MOS transistors NT supplied with the high signal RW1z are turned on. As a result, each of the bit lines BL and the complementary bit lines /BL is connected to its corresponding data bus (B0 through /B3).

Data DQ indicating redundancy information is inputted to an input/output terminal of the data input/output circuit 1, and, then, is supplied to the memory cells MC included in the redundancy information block IMB through the data buses B0 through /B3. Additionally, in the case of writing the redundancy information to the redundancy information block IMB, the signals PSA-Rz and NSA-Rx outputted from the redundancy control circuit 3 are respectively set high and low, as shown in FIG. 6B, thereby keeping the sense amplifiers SA activated.

Accordingly, in the condition in which the negative voltage Vn is supplied to the opposing electrodes OE of the memory cells MC, as described above, the sub word lines SWL1 through SWLn are selected in order, as shown in FIG. 6H. Additionally, the voltage VPP2 generated by the internal boosting circuit is supplied to the gates of the n-channel MOS transistors NT10 in accordance with the data DQ. While high-level data is being written to the memory cells MC selectively, an excessive voltage is added between electrodes of the capacitors C1 of the memory cells MC. Consequently, the capacitors C1 are short-circuited because of breakdown. In detail, the capacitor C1 is shorted by a resistor R in the memory cell MC after data has been written to the memory cell MC, as shown in FIG. 5.

Figure 5:
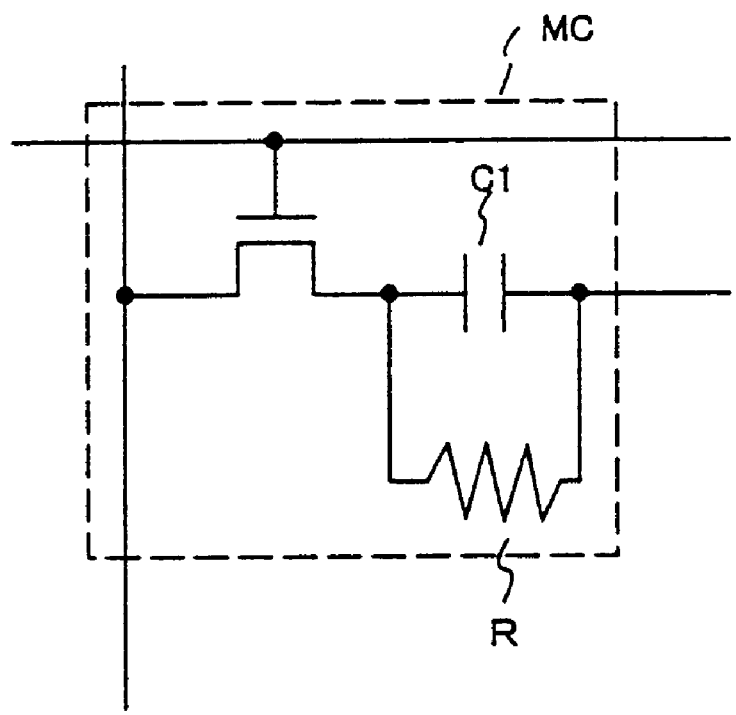
FIG. 5 is a circuit diagram showing a writing condition of the redundancy information to a memory cell included in the redundancy information block.

On the other hand, while low-level data is being written to the memory cells MC, each of the memory cells MC does not have a physical change shown in FIG. 5. Additionally, in the case of writing the redundancy information to the redundancy information block IMB, the signal RR1x outputted from the redundancy control circuit 3 is set high as shown in FIG. 6C, thereby turning the p-channel MOS transistors PT off. Additionally, the low signal RR2z shown in FIG. 6E is supplied to the gate circuits GT to turn the gate circuits GT off, in the case of writing the redundancy information to the redundancy information block IMB.

Redundancy information is programmed in the redundancy information block IMB by the above-described method. However, the memory cell MC whose cell node CN is supplied with the voltage VPP2 and set high becomes a memory cell that leaks because of a broken-down dielectric of the capacitor C1. Consequently, low-level data is programmed in such a memory cell MC instead of the high-level data. Therefore, a logical level of redundancy information read out from the redundancy information block IMB in a normal operation of the semiconductor storage device is the inverse of a logical level of the data DQ supplied to the data input/output circuit 1 for programming the redundancy information.

Additionally, the signal S3 is set high as shown in FIG. 6J, and is supplied from the redundancy control circuit 3 to the sub word driver SWD included in each of the memory-cell blocks MB1 through MB8 and the redundancy memory-cell block RMB, thereby deactivating the sub word driver SWD, in the case of writing the redundancy information to the redundancy information block IMB. Accordingly, the sub word lines SWD included in the memory-cell blocks MB1 through MB8 and the redundancy memory-cell block RMB are prevented from being activated. Consequently, the memory cells MC included in the memory-cell blocks MB1 through MB8 are protected from damages caused by the high voltage VPP2 supplied to the gates of the n-channel MOS transistors NT10 composing the memory cells MC.

A description will now be given of a redundancy setting operation performed by the semiconductor storage device, with reference to timing charts shown in FIGS. 7A through 7J. The redundancy setting operation is an initializing process powering the semiconductor storage device during a normal usage, and making redundancy information stored in the redundancy information block IMB to be in a usable condition.

The redundancy information block IMB includes two types of memory cells MC, as described above. One of the types is the memory cell MC that leaks since the memory cell MC has been programmed. The other type is the memory cell MC (a programmed memory cell MC) in which the dielectric of the capacitor C1 is not broken since the memory cell MC has not been programmed. In a case in which high-level data is written to all the memory cells MC included in the redundancy information block IMB by using a similar method applied to normal DRAM cells, the programmed memory cell MC cannot hold the high-level data, since a stored charge leaks out therefrom.

In such a case, the cell node CN of the programmed memory cell MC becomes the ground voltage VSS (L), by setting the voltage VPR-R supplied from the charge pump 5 to the opposing electrode OE of the programmed memory cell MC, to the ground voltage VSS. Subsequently, by refreshing all the memory cells MC after a fixed period passes, the programmed memory cells MC hold the low-level data, and the memory cells MC not having programmed hold the high-level data. The high-level and low-level data is reserved in the above-described memory cells MC, by refreshing the memory cells MC periodically.

Figure 7:
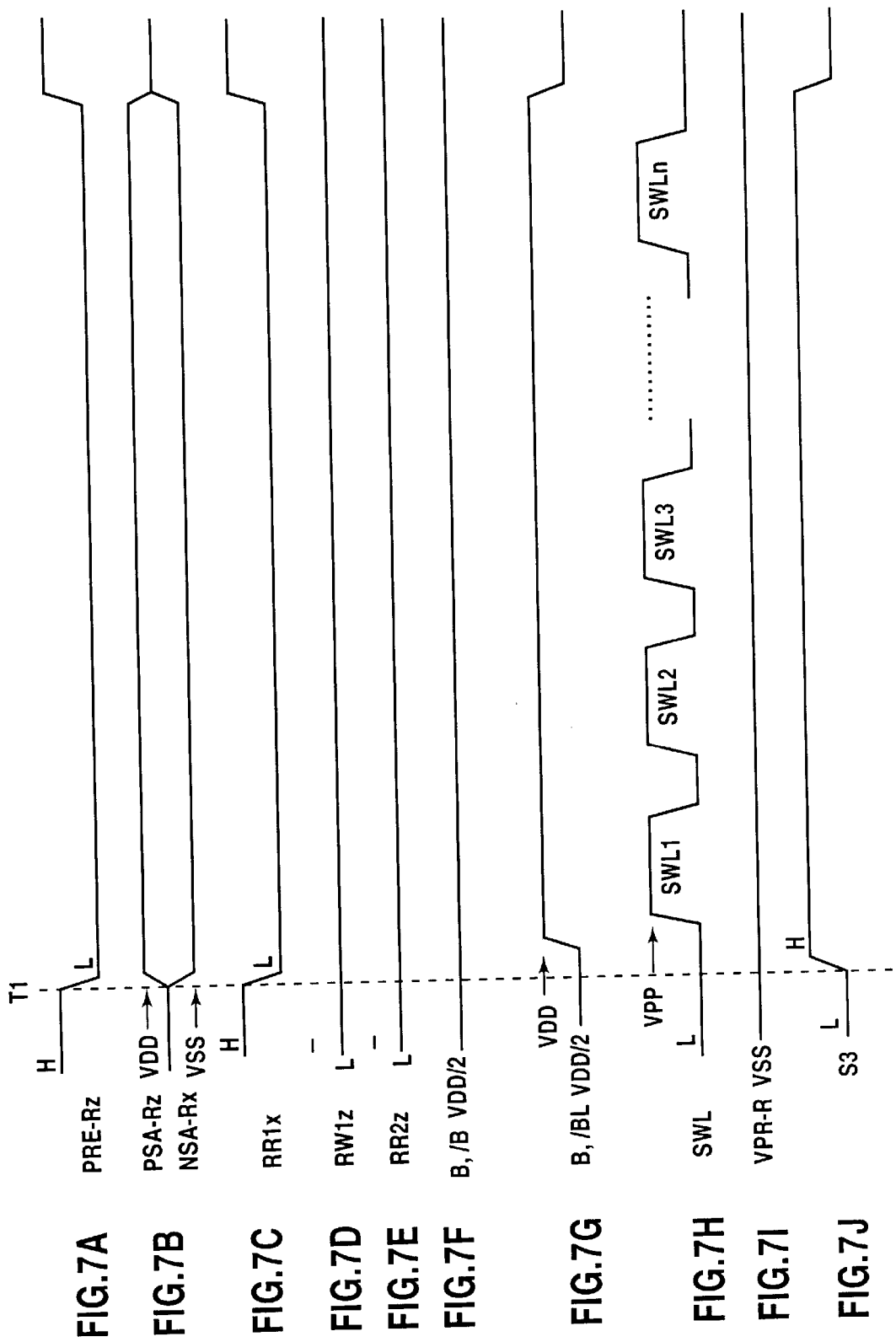
FIGS. 7A through 7J are timing diagrams showing a redundancy setting operation performed by the semiconductor storage device shown in FIG. 1.

In detail, the n-channel MOS transistors NT shown in FIG. 2 are turned off by the low signal RW1z outputted from the redundancy control circuit 3 at a time T1, as shown in FIG. 7D. Additionally, the p-channel MOS transistors PT are turned on by the low signal RR1x outputted from the redundancy control circuit 3 at the time T1, as shown in FIG. 7C. As a result, the power-source voltage VDD is supplied to all the pairs of the bit lines BL and /BL included in the redundancy information block IMB, as shown in FIG. 7G.

While the voltage VDD is supplied to all the bit lines BL and /BL included in the redundancy information block IMB, the semiconductor storage device selects the sub word lines SWL1 through SWLn supplied with the boosting voltage VPP in sequence, and writes the high-level data in all the memory cells MC included in the redundancy information block IMB. The semiconductor storage device may use a refresh address counter normally provided in a DRAM, in order to select the sub word lines SWL in sequence. A clock signal used for selecting the sub word lines SWL in sequence may be an external clock signal or an output signal of a generator provided for a self-refresh usage. Levels of the other signals shown in FIGS. 7A through 7J are set similarly to the levels of the signals set at the time T1 shown in FIGS. 6A through 6J, and, thus, the description is omitted.

The redundancy information can be reserved in the redundancy information block IMB, by performing a self-refreshing operation after the high-level data is written in all the memory cells MC included in the redundancy information block IMB by the above-described method.

Figure 8:
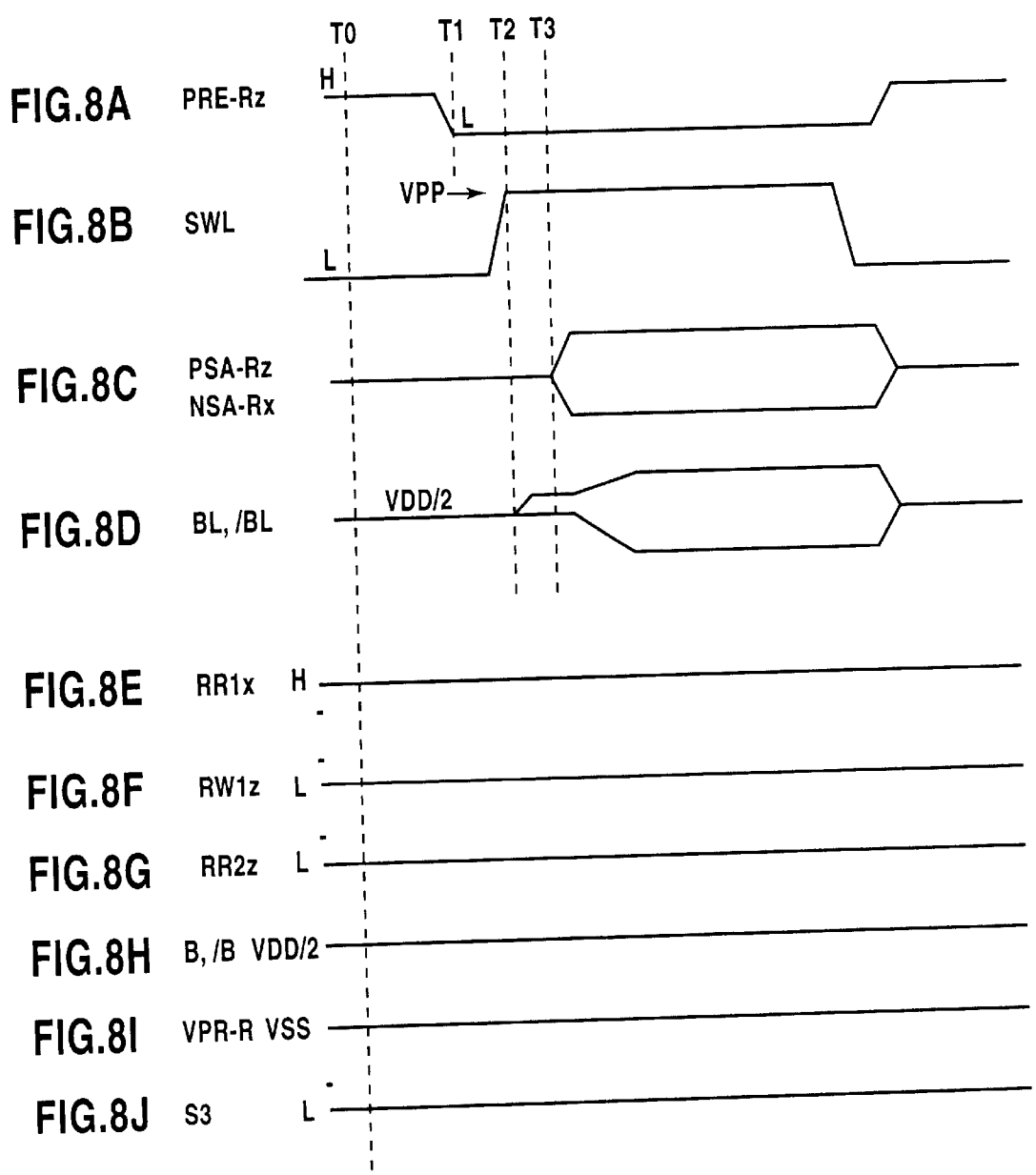
FIGS. 8A through 8J are timing diagrams showing an operation performed by the semiconductor storage device shown in FIG. 1 to hold or refresh the redundancy information.

FIGS. 8A through 8J are timing diagrams showing an operation performed by the semiconductor storage device shown in FIG. 1 to hold or refresh redundancy information. The operation shown in FIGS. 8A through 8J is similar to the operation shown in FIGS. 3A through 3J to read out the redundancy information. For instance, data (redundancy information) read out from the redundancy information block IMB by activation of the sub word lines SWL shown in FIG. 8B at the time T2 is amplified by the sense amplifiers SA activated at the time T3. Subsequently, the redundancy information is written back in the memory cells MC included in the redundancy information block IMB. During the above processes, the voltage VPR-R is always set to the ground voltage VSS, as shown in FIG. 8J, which is supplied from the charge pump 5 to the opposing electrodes OE of the memory cells MC included in the redundancy information block IMB.

The semiconductor storage device performing the above-described process to refresh redundancy information works in a normal operation, wherein the voltage VPR-R is set to the ground voltage VSS. Additionally, the opposing electrodes OE of the memory cells MC included in the memory-cell blocks MB1 through MBn and the redundancy memory-cell block RMB are supplied with the voltage VDD/2.

Figure 9:
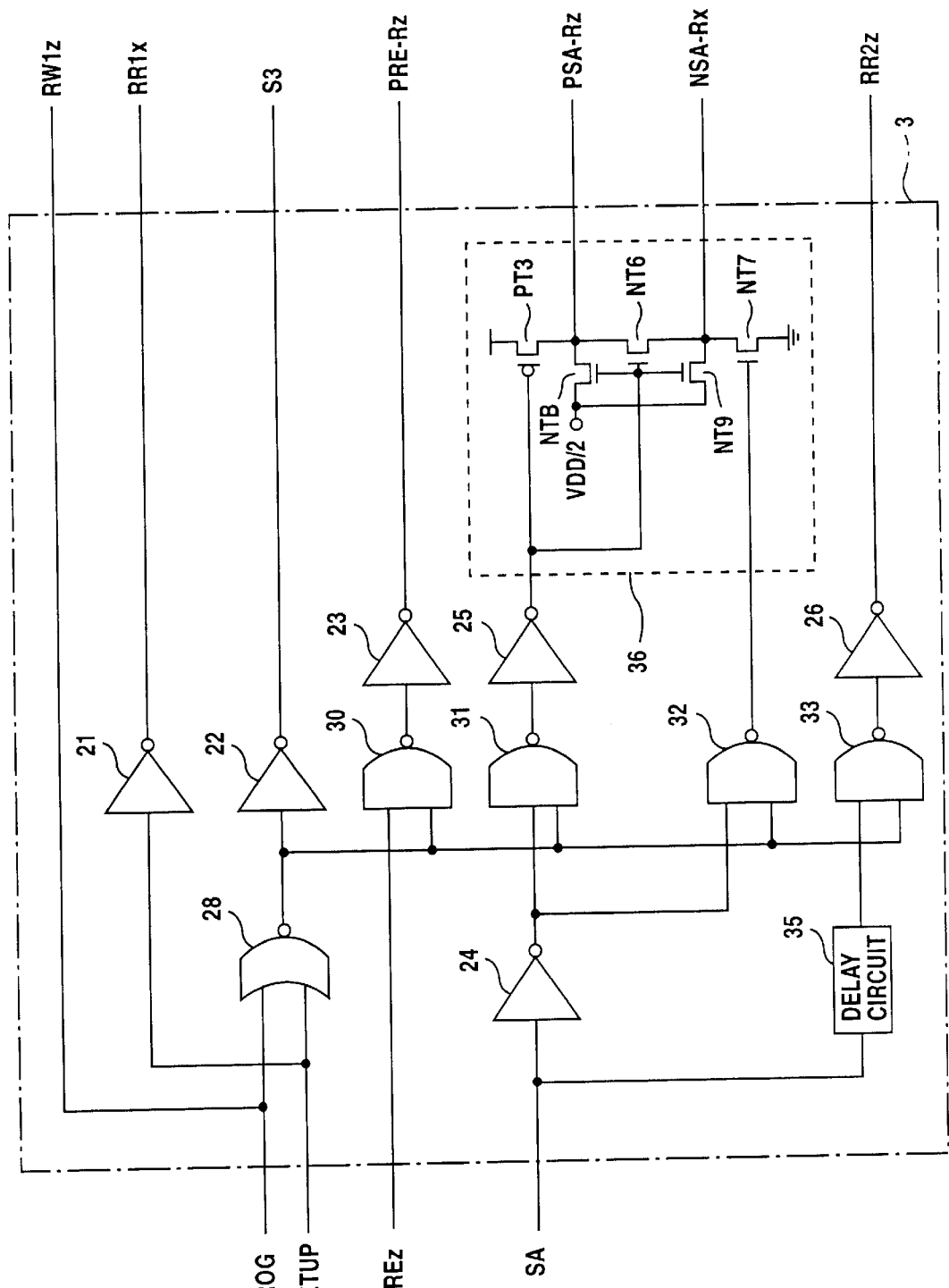
FIG. 9 is a circuit diagram showing a structure of a redundancy control circuit included in the semiconductor storage device shown in FIG. 1.

FIG. 9 is a circuit diagram showing a structure of the redundancy control circuit 3 included in the semiconductor storage device shown in FIG. 1. As shown in FIG. 9, the redundancy control circuit 3 includes inverting circuits 21 through 26, a NOR circuit 28, NAND circuits 30 through 33, a delay circuit 35, and a sense-amplifier driving circuit 36. The sense-amplifier driving circuit 36 includes a p-channel MOS transistor PT3, and n-channel MOS transistors NT6 through NT9.

The NOR circuit 28 is provided with the signals PROG and SETUP from the internal-signal generating circuit 2 shown in FIG. 1. The inverting circuit 24 and the delay circuit 35 are provided with a sense-amplifier activation signal SA. The signal SETUP is logically inverted by the inverting circuit 21 to be the signal RR1x.

The inverting circuit 22 is connected to the NOR circuit 28, and creates the signal S3. The NAND circuit 30 is connected to the NOR circuit 28, and is supplied with a pre-charge signal PREz. The inverting circuit 23 creates the signal PRE-Rz by inverting an output signal of the NAND circuit 30. It is assumed that the pre-charge signal PREz and the sense-amplifier activation signal SA set the redundancy information block IMB as an object of reading and writing data, simultaneously with the memory-cell blocks MB1 through MBn and the redundancy memory-cell block RMB, in a normal operation.

Additionally, the NAND circuits 31 and 32 are connected to the NOR circuit 28 and the inverting circuit 24. The inverting circuit 25 inverts a signal created by the NAND circuit 31. Additionally, the NAND circuit 33 is connected to the NOR circuit 28 and the delay circuit 35. The inverting circuit 26 creates the signal RR2z by inverting a signal created by the NAND circuit 33.

An output signal of the inverting circuit 25 is supplied to gates of the p-channel MOS transistor PT3, the n-channel MOS transistors NT6, NT8 and NT9, which are included in the sense-amplifier driving circuit 36. The voltage VDD/2 is supplied to drains of the n-channel MOS transistors NT8 and NT9. In addition, an output signal of the NAND circuit 32 is supplied to a gate of the n-channel MOS transistor NT7. The sense-amplifier driving circuit 36 having the above-described structure outputs the signal PSA-Rz from a node corresponding to a drain of the p-channel MOS transistor PT3, and the signal NSA-Rx from a node corresponding to a drain of the n-channel MOS transistor NT7.

Figure 10:
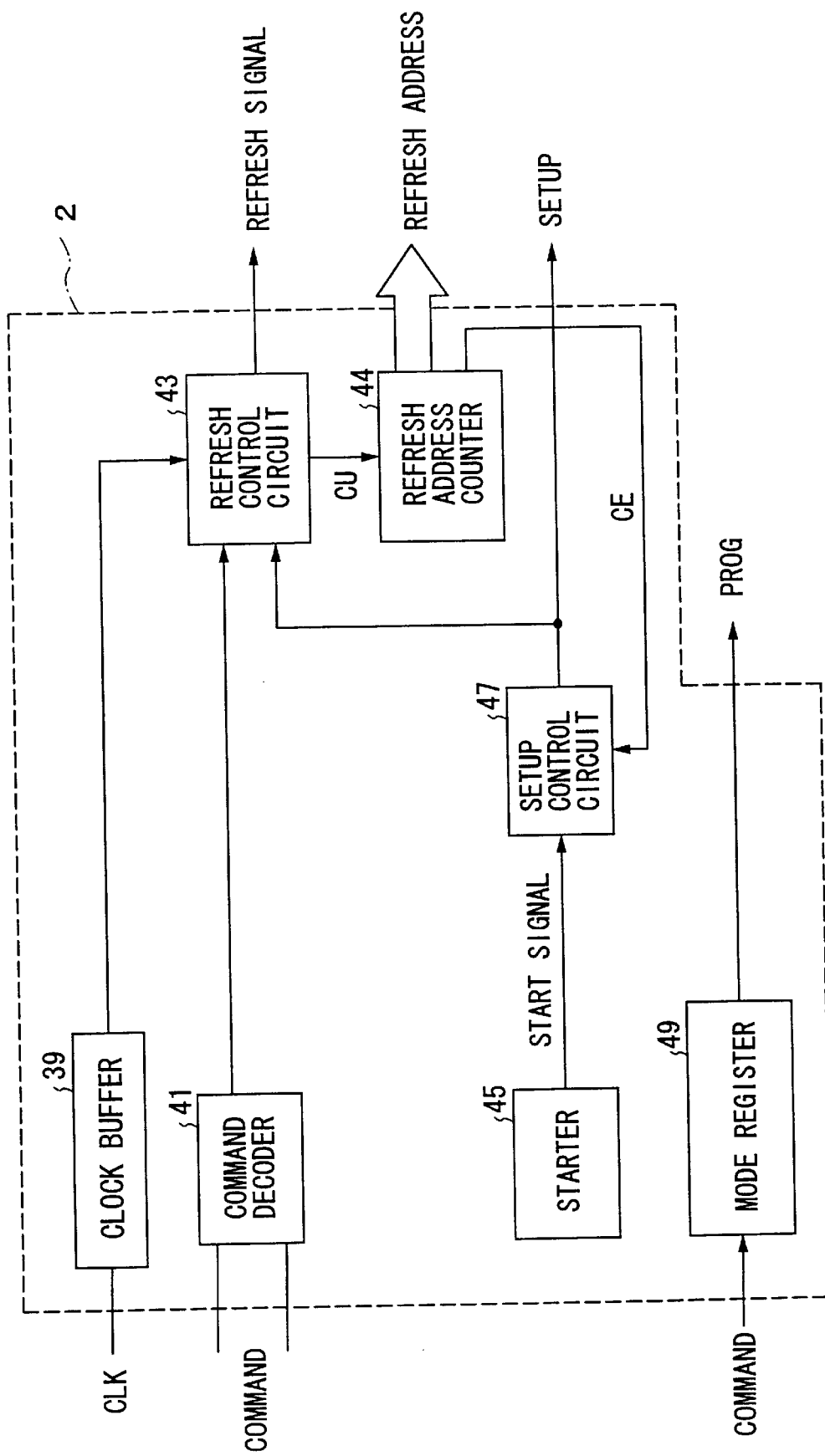
FIG. 10 is a block diagram showing a structure of an internal-signal generating circuit included in the semiconductor storage device shown in FIG. 1.

FIG. 10 is a block diagram showing a structure of the internal-signal generating circuit 2 included in the semiconductor storage device shown in FIG. 1. The internal-signal generating circuit 2 includes a clock buffer 39, a command decoder 41, a refresh control circuit 43, a refresh address counter 44, a starter 45, a setup control circuit 47 and a mode register 49, as shown in FIG. 10.

The setup control circuit 47 is connected to the starter 45, and creates the signal SETUP according to a start signal supplied from the starter 45 when the semiconductor storage device is powered on. The refresh control circuit 43, which is connected to the clock buffer 39, the command decoder 41 and the setup control circuit 47, operates according to the signal SETUP supplied from the setup control circuit 47, and outputs a refresh signal. The refresh control circuit 43 keeps performing the self-refreshing operation to hold redundancy information set in the redundancy information block IMB.

Additionally, the refresh address counter 44 is connected to the refresh control circuit 43, and creates a row address (a refresh address) automatically. The refresh address counter 44 increments the row address sequentially in accordance with a count-up signal CU supplied from the refresh control circuit 43. The row address is supplied as the refresh address to the main word driver MWD, and a refreshing operation is performed. After incrementing the row address for one cycle, the refresh address counter 44 supplies a count-ending signal CE to the setup control circuit 47. Consequently, the setup control circuit 47 deactivates the signal SETUP.

Additionally, the mode register 49 creates the signal PROG in accordance with a command supplied thereto. For instance, the mode register 49 creates the high signal PROG, and outputs the high signal PROG, in a case in which the mode register 49 is supplied with a command to set a program mode for programming redundancy information. On the other hand, the mode register 49 creates the low signal PROG, and outputs the low signal PROG, in a case in which the mode register 49 is supplied with a command to cancel the program mode.

The clock buffer 39 creates an internal clock signal by buffering the external clock signal CLK supplied thereto, and supplies the internal clock signal to the refresh control circuit 43. Additionally, the command decoder 41 decodes a command supplied thereto, and supplies a decoded signal to the refresh control circuit 43.

The semiconductor storage device according to the first embodiment has the above-described structure. A description will now be given of a current-voltage characteristic of the capacitor C1 storing redundancy information. In detail, the capacitor C1 is a MOS capacitor having a capacitor insulating film between the cell node CN and the opposing electrode OE, for instance.

The semiconductor storage device according to the first embodiment makes the MOS capacitor have a minute leak by utilizing an imprint phenomenon occurring in the MOS capacitor before a dielectric breakdown occurs, in order to program redundancy information in the redundancy information block IMB. Accordingly, a data storing time of the memory cells MC included in the redundancy information block IMB is made to about one tenth ($\frac{1}{10}$) of the data storing time of the memory cells MC included in the memory-cell blocks MB1 through MBn.

Figure 11:
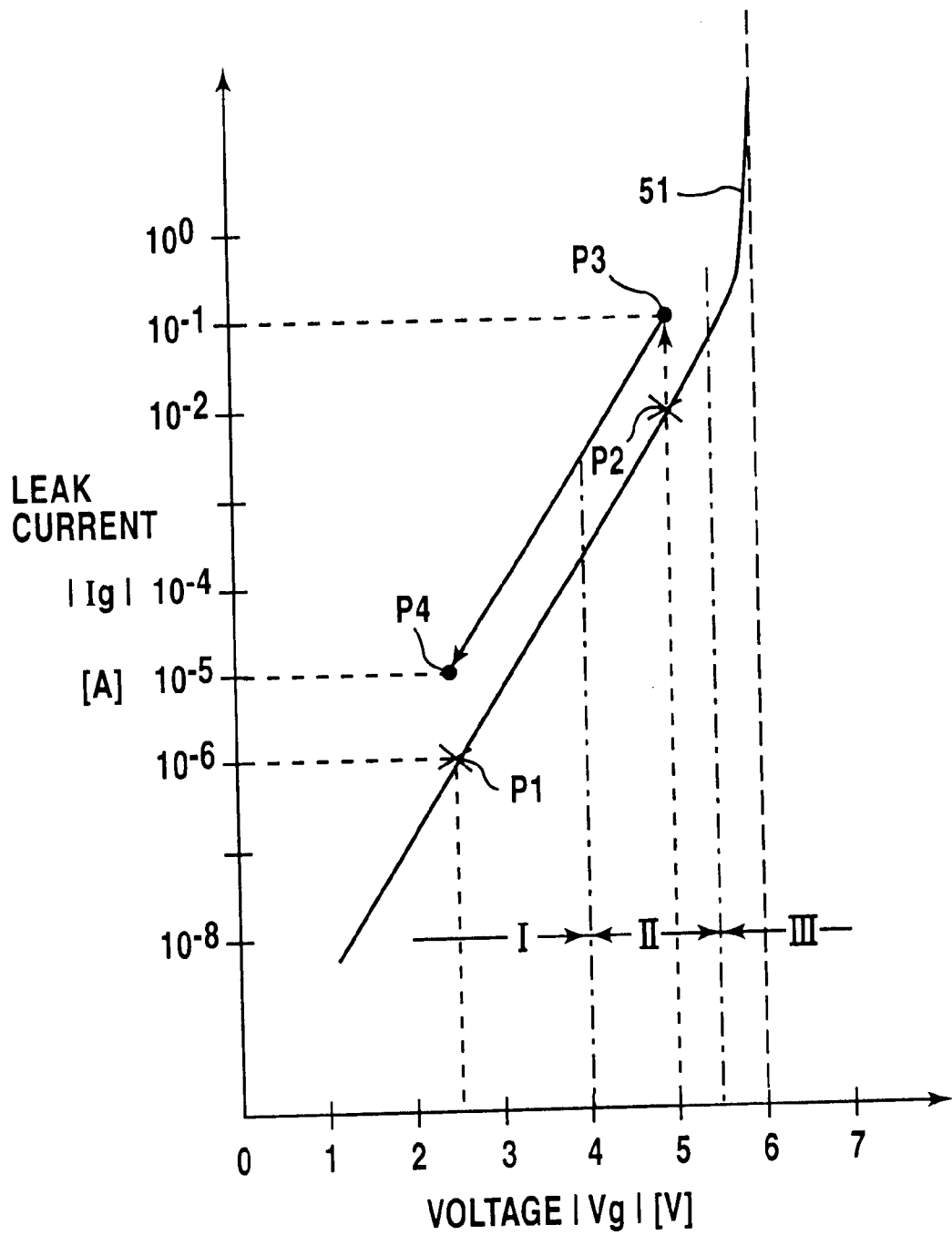
FIG. 11 is a graph showing a current-voltage characteristic of the memory cell included in the redundancy information block.

FIG. 11 is a graph showing the current-voltage characteristic of the MOS capacitor. As shown in FIG. 11, a vertical axis of the graph indicates a leak current (A) of the MOS capacitor, and a horizontal axis indicates a voltage (V) between electrodes of the MOS capacitor. A static current-voltage characteristic of the MOS capacitor is indicated by a graph 51. An area I of the graph 51 is an area, in which the current-voltage characteristic does not change for a long period. The MOS capacitor is normally used in the area I. In an area II of the graph 51, a charge is accumulated in the capacitor insulating film by a flowing electron, and, thus, a value of the leak current changes with time. In an area III of the graph 51, a dielectric breakdown occurs in the MOS capacitor in a short period because of the leak current.

In the first embodiment, the current-voltage characteristic of the MOS capacitor in the area II is used. For instance, a $10^{-6}$ A leak current flows through a MOS capacitor designed for a 2.5 voltage, by supplying the 2.5V voltage to the MOS capacitor, as shown at a point P1 in the graph 51. Subsequently, by supplying a 5.0V voltage to the MOS capacitor, about a $10^{-2}$ A leak current statically flows through the MOS capacitor, as shown at a point P2. However, the leak current becomes larger as the time passes, in the area II. Thus, by supplying the 5.0V voltage to the MOS capacitor for a certain period, a $10^{-1}$ A leak current can flows through the MOS capacitor, as shown at a point P3.

Subsequently, by supplying the 2.5V voltage to the MOS capacitor, the MOS capacitor has a characteristic shown at a point P4. As a result, a $10^{-5}$ A leak current flows through the MOS capacitor. Accordingly, a leak current flowing through the memory cell MC, in which redundancy information is programmed, is ten times larger than a leak current flowing through the memory cell MC, in which the redundancy information is not programmed.

As described above, the leak current flowing through the memory cell MC, in which the redundancy information is programmed, is suppressed to about ten times larger than leak currents flowing through other memory cells MC. Therefore, the semiconductor storage device according to the present invention can restrain consumption of electricity used for refreshing the memory cells MC included in the redundancy information block IMB, since a refresh interval (a refresh time) of the memory cells MC can be set to a comparatively long period, for example, a $10^{-2}$ second.

Additionally, as shown in FIG. 11, by supplying a 6.0V voltage between the electrodes of the MOS capacitor (the capacitor C1), a dielectric of the capacitor C1 is broken down instantaneously, and, thus, a large current leak occurs. Additionally, the current-voltage characteristic in the areas II and III shown in FIG. 11 largely depends on a manufacturing condition of the MOS capacitor. Thus, a precise setting is necessary for the manufacturing condition of the MOS capacitor that has the current-voltage characteristic shown in FIG. 11.

According to the first embodiment as described above, the semiconductor storage device supplies a high voltage to the capacitors C1 included in the redundancy information block IMB selectively, thereby increasing the leak current of the selected capacitors C1. Consequently, the redundancy information is programmed in the redundancy information block IMB. Subsequently, the semiconductor storage device replaces defective memory cells with redundancy memory cells by each sub word line SWL, in accordance with programmed redundancy information, thereby improving flexibility of a redundancy method. Accordingly, the semiconductor storage device can increase the number of defective memory cells that are relieved or replaced with redundancy memory cells. Additionally, the semiconductor storage device can set the refresh time longer, thereby reducing an amount of electricity consumed for refreshing the memory cells included in the redundancy information block IMB. Additionally, the redundancy information block IMB included in the semiconductor storage device according to the first embodiment is composed of DRAM cells, and can be manufactured easily.

Figure 12:
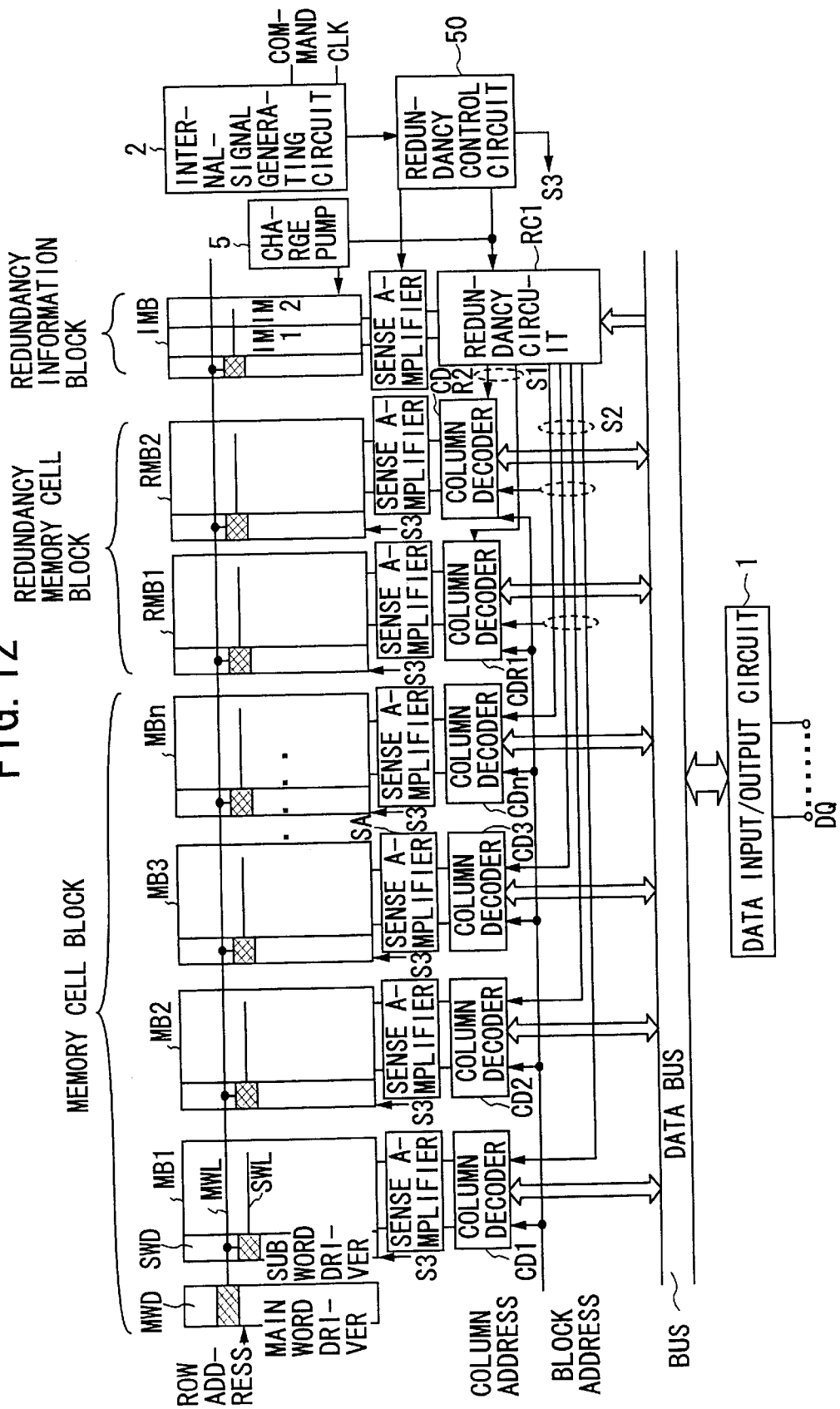
FIG. 12 is a block diagram showing a structure of a semiconductor storage device according to a second embodiment of the present invention.

A description will now be given of a semiconductor storage device according to a second embodiment of the present invention, with reference to FIG. 12. FIG. 12 is a block diagram showing a structure of the semiconductor storage device according to the second embodiment. As shown in FIG. 12, the semiconductor storage device according to the second embodiment has almost the same structure as the semiconductor storage device according to the first embodiment shown in FIG. 1. However, the semiconductor storage device according to the second embodiment has two redundancy memory-cell blocks RMB1 and RMB2, and the redundancy information block IMB including two memory areas IM1 and IM2.

The redundancy circuit RC supplies the redundancy-block selecting signal S1 to a column decoder CDR1 corresponding to the redundancy memory-cell block RMB1 and a column decoder CDR2 corresponding to the redundancy memory-cell block RMB2.

The semiconductor storage device according to the second embodiment operates similarly to the semiconductor storage device according to the first embodiment. In addition, the semiconductor storage device according to the second embodiment can replace memory cells connected to any two sub word lines SWL among a plurality of sub word lines SWL selected simultaneously with a single main word line MWL, with memory cells included in the redundancy memory-cell blocks RMB1 and RMB2. In detail, the semiconductor storage device replaces the memory cells connected to one of the two sub lines SWL, with the memory cells included in the redundancy memory-cell block RMB1, at once. Additionally, the semiconductor storage device replaces the memory cells connected to the other sub word line SWL, with the memory cells included in the redundancy memory-cell block RMB2, at once.

The redundancy memory cells included in the redundancy memory-cell block RMB1 are replaced according to redundancy information stored in the memory area IM1 of the redundancy information block IMB, for example. Additionally, the redundancy memory cells included in the redundancy memory-cell block RMB2 are replaced according to redundancy information stored in the memory area IM2 of the redundancy information block IMB, for example.

According to the second embodiment as described above, the semiconductor storage device includes a plurality of the redundancy memory-cell blocks RMB1 and RMB2, and the redundancy information block IMB that includes the memory areas IM1 and IM2 corresponding to the number of the redundancy memory-cell blocks RMB1 and RMB2. The semiconductor storage device can replace a plurality of the memory-cell blocks MB1 through MBn with the plurality of the redundancy memory-cell blocks RMB1 and RMB2 freely, in accordance with the redundancy information stored in both of the memory areas IM1 and IM2, thereby improving flexibility of the redundancy method and increasing a rate of relieving a defective memory cell.

As described above, the semiconductor storage device according to the second embodiment can have the same effect as the semiconductor storage device according to the first embodiment, and can further reduce consumed electricity.

In conclusion, the semiconductor storage device according to the present invention reproduces programmed redundancy information by refreshing a charge storage device such as a memory cell, and, thus, can achieve a redundancy function with a simple structure.

Additionally, the semiconductor storage device replaces a memory cell connected to a word line with a redundancy memory cell connected to the word line. Thus, any memory cell connected to the word line can be replaced with the redundancy memory cell by activating the word line. Consequently, such a semiconductor storage device can increase flexibility of a redundancy function, and can relieve defective memory cells effectively.

Additionally, the semiconductor storage device relieves the defective memory cells by use of the redundancy memory cells included in first and second redundancy memory-cell blocks (RMB1, RMB2), according to first and second redundancy information respectively stored in first and second memory areas (IM1, IM2) of the redundancy information block IMB. Thus, the semiconductor storage device can increase flexibility of a redundancy function, and reduce consumed electricity.

The above description is provided in order to enable any person skilled in the art to make and use the invention and sets forth the best mode contemplated by the inventors of carrying out the invention.

The present invention is not limited to the specially disclosed embodiments and variations, and modifications may be made without departing from the scope and spirit of the invention.

The present application is based on Japanese Priority Application No. 2000-219756, filed on Jul. 19, 2000, the entire contents of which are hereby incorporated by reference.

What is claimed is:

1. A semiconductor storage device, comprising:
   a redundancy unit that replaces a memory cell with a redundancy memory cell according to redundancy information, if the memory cell has a defect;
   a plurality of charge storage devices that are programmed to have the redundancy information, each charge storage device having a fixed capacity;
   a redundancy-information recording unit programming said plurality of charge storage devices to set the redundancy information in said plurality of charge storage devices, by performing dielectric breakdown to said plurality of charge storage devices selectively;
   a charge supplying unit supplying a fixed charge to said plurality of charge storage devices; and
   a redundancy control unit that maintains the redundancy information in said plurality of charge storage devices supplied with the fixed charge by refreshing said plurality of charge storage devices, and supplies said redundancy information from said plurality of charge storage devices to said redundancy unit.

2. The semiconductor storage device as claimed in claim 1, wherein said redundancy control unit periodically refreshes said plurality of charge storage devices supplied with the fixed charge.

3. The semiconductor storage device as claimed in claim 1, further comprising a word line, to which said memory cell and said redundancy memory cell are connected, wherein said redundancy unit replaces said memory cell connected to the word line with said redundancy memory cell connected to the word line.

4. The semiconductor storage device as claimed in claim 3, further comprising:
   a memory-cell array that includes a plurality of blocks, each block including a plurality of memory cells;
   a plurality of first reading units, each being provided corresponding to each of the plurality of blocks, and reading data from the memory cell; and
   a second reading unit reading the data from said redundancy memory cell,
   wherein said redundancy unit deactivates a first reading unit corresponding to a block including the memory cell that has the defect, and activates the second reading unit.

5. A semiconductor storage device, comprising:
   a memory-cell block including a plurality of memory cells;

a redundancy memory-cell block including a plurality of redundancy memory cells;

a redundancy information block that includes a plurality of charge storage devices, each having a fixed capacity, and stores redundancy information used for replacing a memory cell with a redundancy memory cell in a case in which said memory cell has a defect, in said plurality of charge storage devices;

a redundancy unit replacing said memory cell with said redundancy memory cell, in accordance with the redundancy information;

a redundancy-information recording unit programming said redundancy information block to store said redundancy information in said redundancy information block, by performing dielectric breakdown to said plurality of charge storage devices selectively;

a charge supplying unit supplying a fixed charge to said plurality of charge storage devices; and a redundancy control unit that maintains said redundancy information in said redundancy information block, by refreshing said plurality of charge storage devices supplied with the fixed charge, and supplies said redundancy information from said redundancy information block to said redundancy unit.

6. The semiconductor storage device as claimed in claim 5, further comprising a word line, to which said memory cell and said redundancy memory cell are connected, wherein said redundancy unit replaces said memory cell connected to the word line with said redundancy memory cell connected to the word line, by each memory-cell block.

7. The semiconductor storage device as claimed in claim 5, further comprising:

a plurality of memory-cell blocks, each including the plurality of memory cells;

a plurality of first reading units, each being provided corresponding to each of said plurality of memory-cell blocks, and reading data from the memory cell; and a second reading unit that corresponds to said redundancy memory-cell block, and reads the data from the redundancy memory cell, wherein said redundancy unit deactivates a first reading unit corresponding to one of said plurality of memory-cell blocks that includes the memory cell that has the defect, and activates said second reading unit.

8. The semiconductor storage device as claimed in claim 5, further comprising:

a first redundancy memory-cell block including the plurality of redundancy memory cells; and a second redundancy memory-cell block including the plurality of redundancy memory cells, wherein said redundancy information block includes a first memory area storing first redundancy information and a second memory area storing second redundancy information, and said redundancy unit sets the redundancy memory cell included in said first redundancy memory-cell block as an object of replacement in accordance with said first redundancy information read from said first memory area, and the redundancy memory cell included in said second redundancy memory-cell block as the object of replacement in accordance with said second redundancy information read from said second memory area.

9. A method of replacing a memory cell with a redundancy memory cell in a semiconductor storage device if the memory cell has a defect, said method comprising the steps of:

a) programming a plurality of charge storage devices to set redundancy information in said plurality of charge storage devices, by performing dielectric breakdown to said plurality of charge storage devices selectively, each having a fixed capacity;

b) supplying a fixed charge to said plurality of charge storage devices;

c) refreshing said plurality of charge storage devices, thereby maintaining said redundancy information in said plurality of charge storage devices; and d) replacing said memory cell with said redundancy memory cell according to said redundancy information.

10. The method as claimed in claim 9, wherein said step (c) includes the step of refreshing said plurality of charge storage devices periodically.

11. The method as claimed in claim 9, wherein said memory cell is connected to a word line, and said step (d) includes the step of replacing said memory cell with the redundancy memory cell connected to the word line.

12. The method as claimed in claim 9, wherein said step (d) includes the steps of:

deactivating a first reading unit that reads out data from the memory cell that has the defect; and activating a second reading unit that reads out the data from the redundancy memory cell that is an object of replacement.

13. The method as claimed in claim 9, wherein said plurality of charge storage devices include a first group of charge storage devices storing first redundancy information and a second group of charge storage device storing second redundancy information, and said step (d) includes the steps of:

setting a first redundancy memory cell as an object of replacement according to the first redundancy information read out from said first group of charge storage devices; and setting a second redundancy memory cell as the object of replacement according to the second redundancy information read out from said second group of charge storage device.

* * * * *